United States Patent [19]
Lindberg

[11] Patent Number: 4,507,708

[45] Date of Patent: Mar. 26, 1985

[54] RF MODULE WITH INTEGRAL COAXIAL CONNECTOR MEANS

[75] Inventor: Frank A. Lindberg, Relay, Md.

[73] Assignee: Westinghouse Electric Corp., Pittsburgh, Pa.

[21] Appl. No.: 480,189

[22] Filed: Mar. 30, 1983

[51] Int. Cl.$^{3}$ .............................................. H05K 5/02

[52] U.S. Cl. .................................... 361/392; 174/525; 333/260

[58] Field of Search ................. 174/35 R, 35 C, 52 S; 333/254, 256, 257, 260; 361/392, 393, 394

[56] References Cited

U.S. PATENT DOCUMENTS

| | | | |
|---|---|---|---|
| 3,431,515 | 3/1969 | Brediger et al. | 333/254 X |
| 3,838,443 | 9/1974 | Laighton | 357/84 |
| 3,899,720 | 8/1975 | Peterson | 361/412 |
| 4,455,448 | 6/1984 | Bertolina | 174/35 R |

*Primary Examiner*—A. T. Grimley
*Assistant Examiner*—D. A. Tone
*Attorney, Agent, or Firm*—W. G. Sutcliff

[57] ABSTRACT

An rf module is provided with an integral coaxial connector lead-in and alignment structure about the lead-in. The rf module is readily coupled to mating rf modules or components in modular integrated rf circuit packages. The rf module includes structure for clamping the coupled modules to a flat surface which may be a printed wiring board substrate.

4 Claims, 4 Drawing Figures

RF MODULE WITH INTEGRAL COAXIAL CONNECTOR MEANS

BACKGROUND OF THE INVENTION

The present invention relates to rf modules utilized as modular integrated circuit packages which can be mounted upon substrates in forming rf or microwave systems. Such rf modules are of miniature design and require a coaxial hermetic feedthrough to permit connection between adjacent modules, or between modules and rf cable, wherein the electrical impedance is desirably uniform from the inside of one module to the inside of the adjacent module. Modular integrated circuit packages permit building block assembly of large systems with individual subsystems packaged in separate hermetically sealed packages. Such modular packaging reduces the complexity of the individual modules and permits easy subsystem testing and replacement of modular package elements.

It is desirable that the rf modules have integral coaxial connection means which permit easy assembly and removal of individual modules without disturbing or disassembling adjacent modules to which it is interconnected. It is also desirable that disassembly be accomplished without lateral or unplugging motion between the connection means. It is desirable that the connection means be relatively rugged and protected from mechanical damage during handling.

SUMMARY OF THE INVENTION

An rf module with integral coaxial connector means is provided to permit coupling to a mating rf module or component. The module body comprises a planar base portion and a continuous sidewall portion extending upward from the perimeter of the base portion. The terminating end of the sidewall portion is adapted to be hermetically sealed with a planar seal means to define the rf circuit package. A conductive feedthrough pin is hermetically sealed through a sidewall portion of the rf module. Means are provided for aligning the feedthrough pin of a first rf module with the feedthrough pin of the second rf module. Alignment means extend outward from the module body with a portion disposed partially about and coaxial with the feedthrough pin. Means are provided for electrically coupling the aligned feedthrough pins of adjacent coupled rf modules with dielectric insulating means provided about the electrically coupled feedthrough pins. Means are provided for clamping the alignment means of the electrically coupled adjacent rf modules and retaining the coupled modules upon a substrate.

The rf module with integral coaxial connector means is neither male nor female, and hence a module can be removed from a circuit board substrate upon which an assembly of modules are mounted with a pure upward motion, and no lateral or unplugging motion is required. The feedthrough pins are inherently protected from damage by the alignment means structure.

DESCRIPTION OF THE PREFERRED EMBODIMENTS

Figure 1:
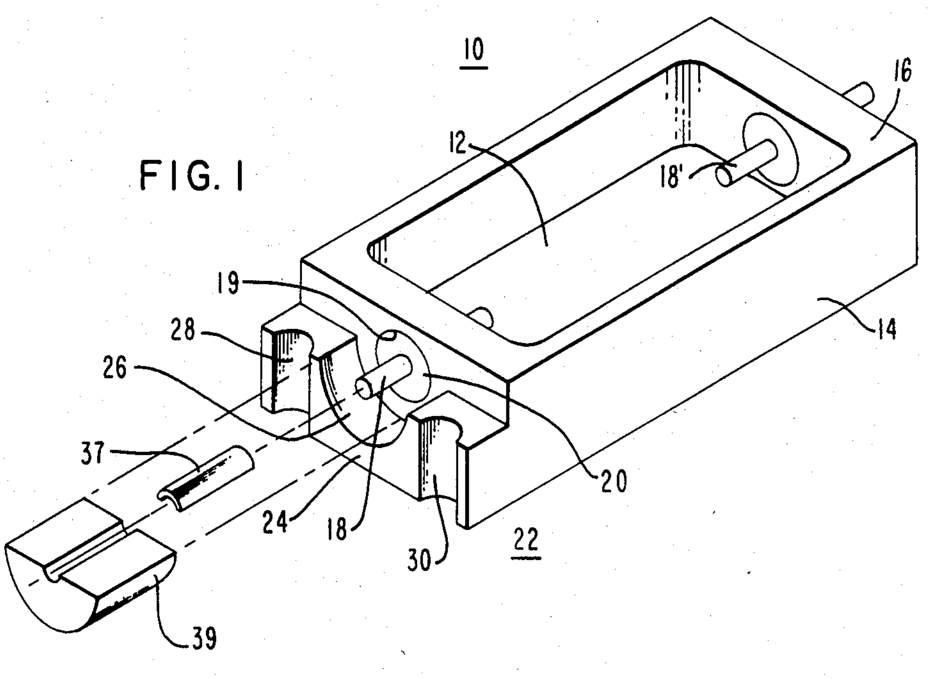
FIG. 1 is a perspective view of an rf module of the present invention.

The invention can be best understood by reference to the exemplary embodiments as seen in FIGS. 1-4. The rf module 10 comprises a generally rectangular planar base portion 12 with a continuous sidewall portion 14 extending upwardly from the perimeter of this base portion 12. The upwardly extending end or terminating surface 16 of the sidewall portion is generally planar and is adapted to be hermetically sealed with a planar top cover plate seal means 17 to define the rf circuit package. The module 10 in FIG. 1 is seen prior to sealing and the top cover plate seal means 17 is illustrated in place in FIG. 2. A conductive feedthrough pin 18 is hermetically sealed through a sidewall portion 14, the feedthrough pin 18 is disposed coaxially within aperture 19 provided through the sidewall 14 with a suitable glass to metal seal means 20 provided between the pin 18 and the sidewall portion 14.

Alignment means 22 is provided extending from the exterior of the sidewall portion 14 through which the feedthrough pin 18 is sealed. The alignment means 22 includes a center portion 24 with an arcuate surface 26 which is coaxial with the feedthrough pin. This coaxial arcuate surface portion 26 of the alignment means forms a half-cylinder surface about the underside of the feedthrough pin. A pair of arcuate clamp receiving means 28 and 30 are provided on either side of the central portion 24 of the alignment means.

The coaxial arcuate surface portion 26 extends from the module sidewall 14 outward along the full extent of the alignment means 22. The arcuate clamp receiving means 28 and 30 extend in a direction transverse to the direction of the pin 18 and arcuate surface portion 26. The arcuate clamp receiving means 28 and 30 extend vertically through the alignment means 22.

Figure 3:
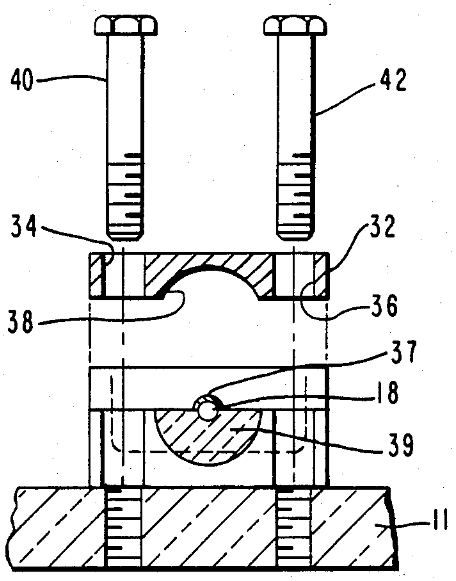
FIG. 3 is a view taken generally along lines III—III of FIG. 2.
Figure 2:
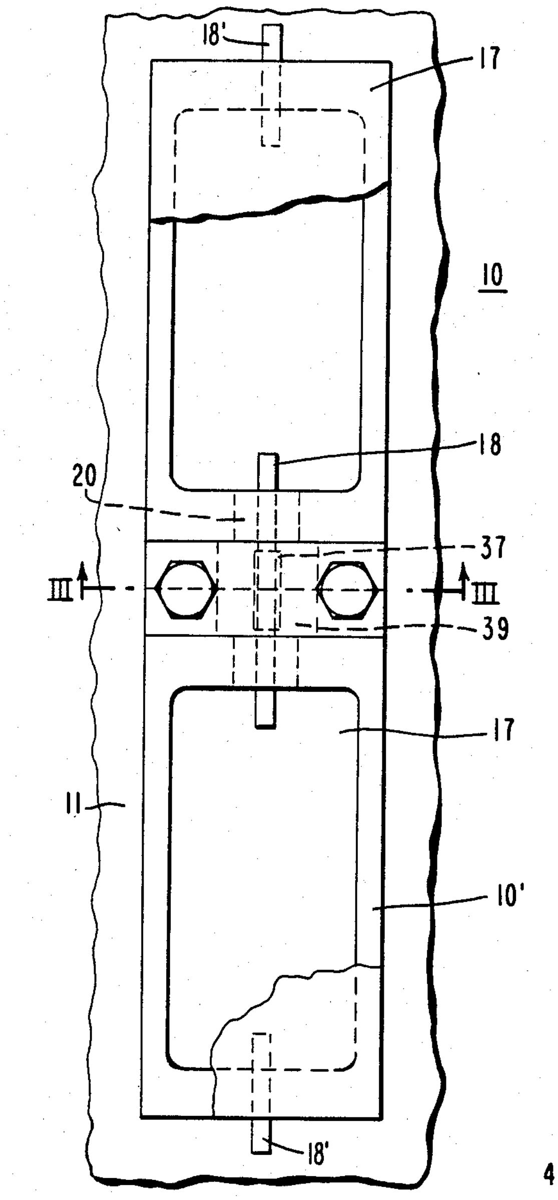
FIG. 2 is a planar view illustrating two of the rf circuit modules seen in FIG. 1 assembled together upon a mounting substrate.

As can be seen in FIG. 3, clamping means 32 includes a pair of apertures 34 and 36 which are aligned with the arcuate clamp receiving means 28 and 30. An arcuate lower surface portion 38 of clamping means 32 aligns with and over the arcuate surface portion 26 provided in the center portion 24 of the alignment means. As seen in FIG. 2, the aligned modules are butted together for connection upon substrate 11 which can be an insulator or conductive substrate. The feedthrough pins 18 of the adjacent modules 10 and 10' are coaxially aligned. These aligned feedthrough pins 18 are soldered together utilizing a thin conductive half tube saddle member 37, seen more clearly in FIG. 1 prior to assembly. Member 37 with a radius of curvature such that the saddle member fits on the abutted pins of the adjacent modules. A pair of half tube insulating members 39 only one of which is seen in FIG. 1, with relatively thick walls are provided about the feedthrough pins filling the cavity defined by the arcuate surface 26 of the alignment means and the arcuate lower surface portion 38 of clamping means. The insulating half tube members 39 are formed of a compliant, compressible material such as Teflon. When members 39 are inserted in place about the soldered-together aligned pins of the adjacent coupled modules, the clamping means 32 is brought down overlapping the adjacent alignment means of the adjacent modules. Mounting screws 40 and 42 pass through apertures 34, 36 through the respective arcuate clamp receiving portion of the alignment means with the screws engaging the mounting substrate.

Figure 4:
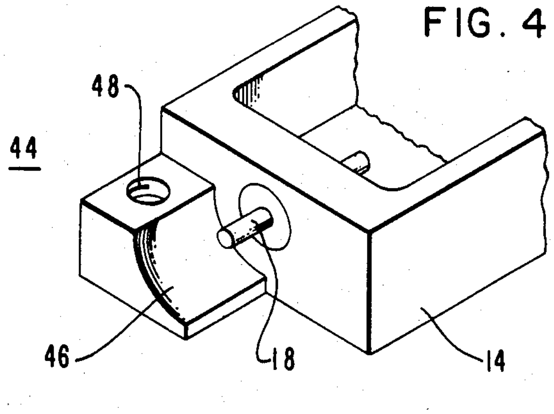
FIG. 4 is an alternate embodiment rf module of the present invention.

In an alternate embodiment seen in FIG. 4 the alignment and clamping means portions of the module are altered. For common structural items of the module of FIG. 4 the same reference numerals as used in FIGS. 1–3 are utilized with the sidewall portion 14 having a feedthrough pin 18 hermetically sealed therethrough. The module of FIG. 4 is utilized when the mounting base or substrate is made of a soft metal into which it is difficult to tap threads for the mounting screws, so that the adjacent modules which are to be connected together can be clamped together without the use of screws which engage the mounting surface or substrate. Alignment means 44 extends from the exterior portion of the module sidewall 14 through which the feedthrough pin 18 is sealed. The alignment means 44 is attached to the exterior surface of the sidewall or is fabricated as an extension therefrom, but extends only from one half of the total width of the sidewall portion, i.e. it extends only from the feedthrough center pin to one extending end of this sidewall. An arcuate surface 46 is formed at the portion of the alignment means 44 about the feedthrough pin 18. This arcuate surface portion 46 is a quarter-cylindrical feature which combines with a mating quarter-cylindrical arcuate surface portion of the adjacent module, and with the half-cylindrical arcuate surface formed in the lower portion of the clamping means to form a coaxial shell spaced about the feedthrough pin 18. In this embodiment the feedthrough pins of the adjacent modules are again soldered together utilizing a conductive saddle which extends between them and again half-cylinder insulating means are fitted about the feedthrough pins 18, between the feedthrough pins and the coaxial surface formed by the arcuate surface portions of the clamping means and the alignment means. A clamping aperture 48 is provided extending into the alignment means from the top surface thereof and this clamping aperture is threaded to accept a clamping screw which extends through the apertures formed in the clamping means which fits over the alignment means of the adjacent butted together modules.

In the embodiments seen in FIGS. 1 and 2, the alignment means 22 is seen extending from only one end wall of the module 10 about feedthrough pin 18. Other rf feedthrough pins 18' are hermetically sealed through other side walls of the module to provide an input and output lead for the module. Alignment means 22 can be provided about each feedthrough pin to permit connection to any side of the module.

What we claim is:

1. An rf module with integral coaxial connector means which can be coupled to a mating rf module, which module comprises;

(a) a module body comprising a planar base portion and a continuous sidewall portion extending upwardly from the perimeter of the base portion, with the terminating end of the sidewall portion adapted to be hermetically sealed with a planar seal means to define an rf circuit package;

(b) a conductive feedthrough pin hermetically sealed through the sidewall portion of the rf module;

(c) means for aligning the feedthrough pin of a first rf module with the feedthrough pin of a second rf module, which alignment means extends outward from the module body with a portion disposed partially about and coaxial with the feedthrough pin;

(d) means for electrically coupling the aligned feedthrough pins for adjacent coupled rf modules;

(e) dielectric insulating means for disposal about the electrically coupled feedthrough pins;

(f) means for clamping the alignment means of the electrically coupled adjacent rf modules together.

2. The rf module set forth in claim 1, wherein the feedthrough pin extends from the module sidewall a distance equal to the alignment means.

3. The rf module set forth in claim 1, wherein the means for electrically coupling the aligned feedthrough pins of adjacent coupled rf modules comprises a conductive saddle member which is to be solder connected to the aligned feedthrough pins for coupling together the extending ends of the aligned feedthrough pins, and wherein the dielectric insulating means comprises a pair of half-cylindrical insulator members adapted to fit about the coupled feedthrough pins and substantially fill a half apertured portion of the alignment means, and wherein the clamping means includes a half apertured underside portion which mates with the alignment means half apertured portion with the insulator members disposed therebetween.

4. The rf module set forth in claim 1 wherein the clamping means includes at least one aperture which aligns with an aperture in the alignment means and an apertured mounting substrate upon which the rf module is coupled, with fastening means extending through the aligned apertures and fastening the coupled module to the mounting substrate.

* * * * *